(12) United States Patent
Itoh et al.

(10) Patent No.: US 7,541,111 B2
(45) Date of Patent: Jun. 2, 2009

(54) ELECTROCHEMICAL CELL AND FABRICATION METHOD OF THE SAME

(75) Inventors: Hironobu Itoh, Chiba (JP); Yutaka Makishima, Chiba (JP); Hideharu Onodera, Sendai (JP); Kazutaka Yuzurihara, Chiba (JP)

(73) Assignees: Seiko Instruments Inc. (JP); Sii Micro Parts Ltd. (JP)

( * ) Notice: Subject to any disclaimer, the term of this patent is extended or adjusted under 35 U.S.C. 154(b) by 582 days.

(21) Appl. No.: 10/880,400

(22) Filed: Jun. 29, 2004

(65) Prior Publication Data

US 2005/0037258 A1 Feb. 17, 2005

(30) Foreign Application Priority Data

Jun. 30, 2003 (JP) ............................. 2003-187805
Jun. 29, 2004 (JP) ............................. 2004-191069

(51) Int. Cl.
*H01M 2/08* (2006.01)
*H01M 2/02* (2006.01)
(52) U.S. Cl. ...................... 429/175; 429/179; 429/176; 429/178; 429/162
(58) Field of Classification Search .................. 429/176, 429/175, 178, 179, 177, 163, 185, 162
See application file for complete search history.

(56) References Cited

U.S. PATENT DOCUMENTS 6,143,440 A * 11/2000 Volz et al. ...................... 429/92
2006/0061328 A1 * 3/2006 Trosper ....................... 320/112
2007/0184351 A1 * 8/2007 Yamamoto et al. .......... 429/317

FOREIGN PATENT DOCUMENTS

JP 52-112729 * 9/1977

* cited by examiner

*Primary Examiner*—Raymond Alejandro
(74) *Attorney, Agent, or Firm*—Adams & Wilks

(57) ABSTRACT

An electrochemical cell has a container housing a separator and a pair of electrodes impregnated with an electrolyte. The container has a base member having a bottom part and a side part disposed on a top surface of the bottom part along an outer rim of the bottom part. A metallic conductive terminal has first and second opposite surfaces penetrating through inner and outer sides of the base member. The first surface of the conductive terminal is disposed on the top surface of the bottom part of the base member. The second surface of the conductive terminal is disposed in contact with one of the pair of the electrodes. A metallic frame member has first and second opposite surfaces, with the first surface being joined to an entire rim of a top surface of the side part of the base member. A metallic cover member is joined to an entire rim of the second surface of the frame member.

43 Claims, 8 Drawing Sheets

A - A' CROSS SECTION

B - B' CROSS SECTION

C - C' CROSS SECTION

D - D' CROSS SECTION

ELECTROCHEMICAL CELL AND FABRICATION METHOD OF THE SAME

BACKGROUND OF THE INVENTION

1. Field of the Invention

The present invention relates to an electrochemical cell such as a non-aqueous electrolyte cell and an electric double layer capacitor utilizing electric double layer theory, and to a fabrication method of the same.

2. Description of the Related Art

The electrochemical cell such as the non-aqueous electrolyte cell and the electric double layer capacitor is used for a backup power source of clock functions, a backup power source of semiconductor memories, an auxiliary power source of electronic devices such as a microcomputer and an IC memory, a battery of solar-powered clocks, and a power source for driving motors. With the realization of non-volatile semiconductor memories and reduced power consumption of clock function devices, the electrochemical cell is not required for large capacity and large current so much. Instead, for the needs of the electrochemical cell, an increasing demand is that components are placed on a mounting board applied with solder cream and are mounted in a reflow furnace controlled at a solder melting point (200 to 260° C.), as similar to ICs, and quartz and SAW devices. Furthermore, it is required for high-density mounting and the reduction in size and thickness as well as the ICs, and quartz and SAW devices.

Traditionally, the electrochemical cell such as the non-aqueous electrolyte cell and the electric double layer capacitor is packaged in a metal case shaped in a coin or button (for example, see Patent Reference 1).

FIG. 12 depicts a cross-sectional view for describing a traditional electrochemical cell. It is configured of a positive electrode case 61 of stainless steel having the upper end surface side opened in a circular shape for housing a positive electrode active material 601 and a negative electrode active material 603 as electrodes and a separator 602, and of a circular negative electrode case 63 fit into the positive electrode case 61 through a circular gasket 62 of insulating resin. Moreover, when surface mounting is required, the cell has a positive electrode terminal 65a welded with the positive electrode case 61 and a negative electrode terminal 65b welded with the negative electrode case 63.

Patent Reference 1 JP-A-2002-190427

For the electrochemical cell such as the traditional non-aqueous electrolyte cell and the electric double layer capacitor described above, a sealing structure is conducted for securing heat resistant properties in solder reflow in which the gasket 62 in an annular shape is pressed by the positive electrode case 61 circularly opened and the circular negative electrode case 63 for crimping. For securing the heat resistant properties and sealing properties of the electrochemical cell, the cell is shaped in a coin or button. However, since the packages of ICs, and quartz and SAW devices placed on the mounting substrate are formed in a rectangular shape, space is created when the electrochemical cell is arranged. When this space is used effectively, a little over 20 percent increase is expected in the storage capacity of the electrochemical cell. Furthermore, the positive electrode case 61 is formed of a metallic material, but it is short-circuited when the positive electrode case 61 is contacted with the negative electrode terminal 65b. Therefore, space needs to be secured. More specifically, as shown in FIG. 12, the negative electrode terminal 65b needs to extend outside over the outer diameter of the positive electrode case 61, causing the space occupied on the mounting substrate to be further increased. Thus, dead space is created to increase the occupied area when the cell is arranged on the mounting substrate, and it is difficult to increase the capacity per unit area on the mounting substrate. Moreover, when the positive electrode terminal 65a and the negative electrode terminal 65b are mounted on the positive electrode case 61 and the negative electrode case 63, the individual components are overlaid and welded with each other as shown in FIG. 12. Therefore, the total thickness of the electrochemical cell is increased to hinder the reduction in thickness while the number of process steps of mounting the positive and negative electrode terminals is increased, causing high price.

SUMMARY OF THE INVENTION

An object of the invention is to enhance the flexibility of the shapes of the electrochemical cell to facilitate the reduction in size and thickness, to realize large capacity, to provide resistance against solder reflow temperatures, and to reduce the number of components and the number of process steps at a low cost.

To achieve the object, the invention is an electrochemical cell characterized by including:

a separator;

a pair of electrodes placed on top and bottom surfaces of the separator; and a container for housing the separator and an electrolyte impregnated in the pair of the electrodes, wherein the container includes:

a base member having a bottom part and a side part disposed on a top surface of the bottom part along an outer rim of the bottom part, the bottom part and the side part formed in one piece;

a conductive terminal made of a metallic material disposed on the top surface of the bottom part, penetrating from an inner side of the base member to an outer side thereof, and having a surface contacted with one of the pair of the electrodes, the surface opposite to a surface contacting with the bottom part;

a frame member made of a metallic material joined to an entire rim of a top surface of the side part; and a cover member made of a metallic material joined to an entire rim of a surface opposite to a surface of the frame member contacting with the base member.

Furthermore, the invention is characterized by having a cover connecting terminal, wherein one end thereof is extended to a side surface of the cover member.

Moreover, the invention is characterized in that a part of the other end of the cover terminal and a part of one end of the conductive terminal extended from the base member have surfaces on a same plane.

Besides, the invention is characterized by having a frame connecting terminal, wherein one end thereof is extended to a side surface of the frame member.

Additionally, the invention is characterized in that a part of the other end of the frame connecting terminal and a part of one end of the conductive terminal extended from the base member have surfaces on a same plane.

Furthermore, the invention is characterized in that one end is extended from the side surface of the frame member, and penetrated from the upper end part of the side part to a bottom surface of the bottom part through the surface where the side part is contacted with the bottom part.

Moreover, the invention is characterized in that the other end or one end of the conductive terminal is contacted with an under surface of the bottom part, and is not protruded outside over the thickness of the terminal from the side part.

Besides, the invention is characterized in that the conductive terminal is formed of a material of stainless steel or aluminium.

Additionally, the invention is characterized in that the frame member and the cover member are formed of a material of any one of stainless steel, aluminium and FeNi alloy.

Furthermore, the invention is characterized in that the conductive terminal is formed of stainless steel, and the frame member and the cover member are formed of FeNi alloy.

Moreover, the invention is characterized in that the cover member is welded with the frame member.

Additionally, the invention is characterized in that a brazing material of nickel or silver alloy is plated over the frame member and the cover member.

Besides, the invention is characterized in that a part having a narrow joint width is disposed on at least a part of a joint part of the frame member overlaid and welded with the cover member, and an opening is formed for discharging the electrolyte when an internal pressure of the electrochemical cell rises.

Additionally, the invention is characterized in that the base member is formed of a material of any one of epoxies, polyimides, polystyrenes, polyphenylene sulfides, polyesters, polyamides, and polyethers.

Furthermore, the invention is characterized in that a thin part in thickness is disposed on at least one part of the base member or the cover member, and an opening is formed for discharging the electrolyte when an internal pressure of the electrochemical cell rises.

Moreover, a second means for solving the problem is a fabrication method of an electrochemical cell characterized by having: a separator; a base member for housing a pair of electrodes facing each other through the separator; a conductive terminal penetrating through the base member; a frame member joined to the base member; and a cover member joined to the frame member, the fabrication method of the electrochemical cell comprising the steps of:

placing the frame member formed in a hoop in a forming mold of the base member;

placing the conductive terminal in the forming mold of the base member;

injecting a resin material into the forming mold to form the base member in a box shape;

assembling the base member where the conductive terminal and the frame member are joined thereto into a container;

attaching one electrode of the pair of the electrodes to the conductive terminal;

placing the separator and the other electrode of the pair of the electrodes on a surface opposite to a surface contacting with the conductive terminal of the one electrode; and overlaying and welding the frame member with the cover member by a heating unit.

Besides, the invention has the step of carrying current through the hoop to plate a brazing material over the frame member, after the step of assembling the base member where the conductive terminal and the frame member are joined thereto into the container.

Additionally, the invention has the step of continuously forming a plurality of the frame members in a hoop of metal foil formed with guide holes in which a part of the frame member has bridges, and separating the bridges from the hoop of the metal foil, before or after the step of overlaying and welding the frame member with the cover member by the heating unit.

Furthermore, the invention is characterized in that in separating the frame member formed in the hoop, at least one part connecting the hoop to the frame member is left to form a frame connecting terminal extended from the frame member.

Moreover, the invention is characterized in that the base member is a resin component having a heat resistant property for holding its shape in heating at a temperature of 200° C. or higher for one minute or longer.

Besides, a third means for solving the problem is a fabrication method of an electrochemical cell characterized by having: a separator; a base member for housing a pair of electrodes facing each other through the separator; a conductive terminal penetrating through the base member; a frame member joined to the base member; and a cover member joined to the frame member, the fabrication method of the electrochemical cell comprising the steps of:

placing the conductive terminal formed in a hoop in a forming mold of the base member;

placing the frame member in the forming mold of the base member;

injecting a resin material into the forming mold to form the base member in a box shape;

assembling the base member where the frame member and the conductive terminal are joined thereto into a container;

attaching one electrode of the pair of the electrodes to the conductive terminal;

placing the separator and the other electrode of the pair of the electrodes on a surface opposite to a surface of contacting with the conductive terminal of the one electrode; and overlaying and welding the frame member with the cover member by a heating unit.

Additionally, the invention has the step of carrying current through the hoop to plate a brazing material over the frame member, after the step of assembling the base member where the conductive terminal and the frame member are joined thereto into the container.

Furthermore, the invention has the step of continuously forming a plurality of the conductive terminals in a hoop of metal foil formed with guide holes in which a part of the conductive terminals has bridges, and separating the bridges from the hoop of the metal foil, before or after the step of overlaying and welding the frame member with the cover member by the heating unit.

Moreover, the invention is characterized in that in separating the conductive terminals formed in the hoop, at least one part connecting the hoop to the conductive terminals is left to form a frame connecting terminal extended from the frame member.

Besides, the invention is characterized in that the base member is a resin component having a heat resistant property for holding its shape in heating at a temperature of 200° C. or higher for one minute or longer.

Additionally, a fourth means for solving the problem is an electrochemical cell characterized by including:

a separator;

a pair of electrodes facing each other through the separator; and a container for housing the separator and an electrolyte impregnated in the pair of the electrodes, the electrochemical cell further comprising:

a base member made of a resin material in a box shape for housing the pair of the electrodes, the separator and the electrolyte; and a conductive terminal and a connecting terminal surface-mounted on a land disposed on a mounting substrate, wherein positive and negative electrodes are distinguished from each other by length or shapes of the conductive terminal and the connecting terminal.

Furthermore, the invention is characterized in that the conductive terminal and the connecting terminal are extended from a lower end surface of the base member, and connected to the mounting substrate.

Moreover, the invention is characterized in that the conductive terminal and the connecting terminal are not protruded outside over the thickness of the terminals from a side wall of the base member.

Besides, the invention is characterized in that joint parts of the conductive terminal and the connecting terminal connected to the mounting substrate have a plating film of tin, nickel or silver.

Additionally, the invention is characterized in that the base member is a resin component having a heat resistant property for holding its shape at a temperature of 200° C. or higher for one minute or longer.

The advantages of the foregoing means for solving the problem in the conventional art are as follows. More specifically, the pair of the electrodes, the separator and the electrolyte are housed in the recessed part of the base member, and the cover member is overlaid and welded with the frame member for joining each other. Thus, the electrochemical cell in any shape and the sealing structure resistant against solder reflow temperatures can be realized.

Furthermore, the positive and negative electrodes are connected to the conductive terminal and the cover connecting terminal, or the frame connecting terminal to the mounting substrate. As the configuration of the electrochemical cell, the base member insulates the conductive terminal from the cover connecting terminal or the frame connecting terminal. Therefore, the conductive terminal and the cover connecting terminal, or the frame connecting terminal can be placed on the lower end surface of the base member, and the dead space of the mounting substrate can be reduced as much as possible to allow large capacity.

Moreover, since the frame connecting terminal is formed to extend from the frame member or the cover member, the cell is reduced in thickness with no increase in the total thickness of the electrochemical cell. The process steps of mounting the positive and negative electrode terminals are eliminated.

As described above, the invention exerts the advantages that enhance the flexibility of the shapes of the electrochemical cell to facilitate the reduction in size and thickness, realize large capacity, provide resistance against solder reflow temperatures, and reduce the number of components and the number of process steps for low price.

BRIEF DESCRIPTION OF THE DRAWINGS

The teachings of the invention can be readily understood by considering the following detailed description in conjunction with the accompanying drawings, in which.

DETAILED DESCRIPTION OF THE PREFERRED EMBODIMENTS

Figure 1:
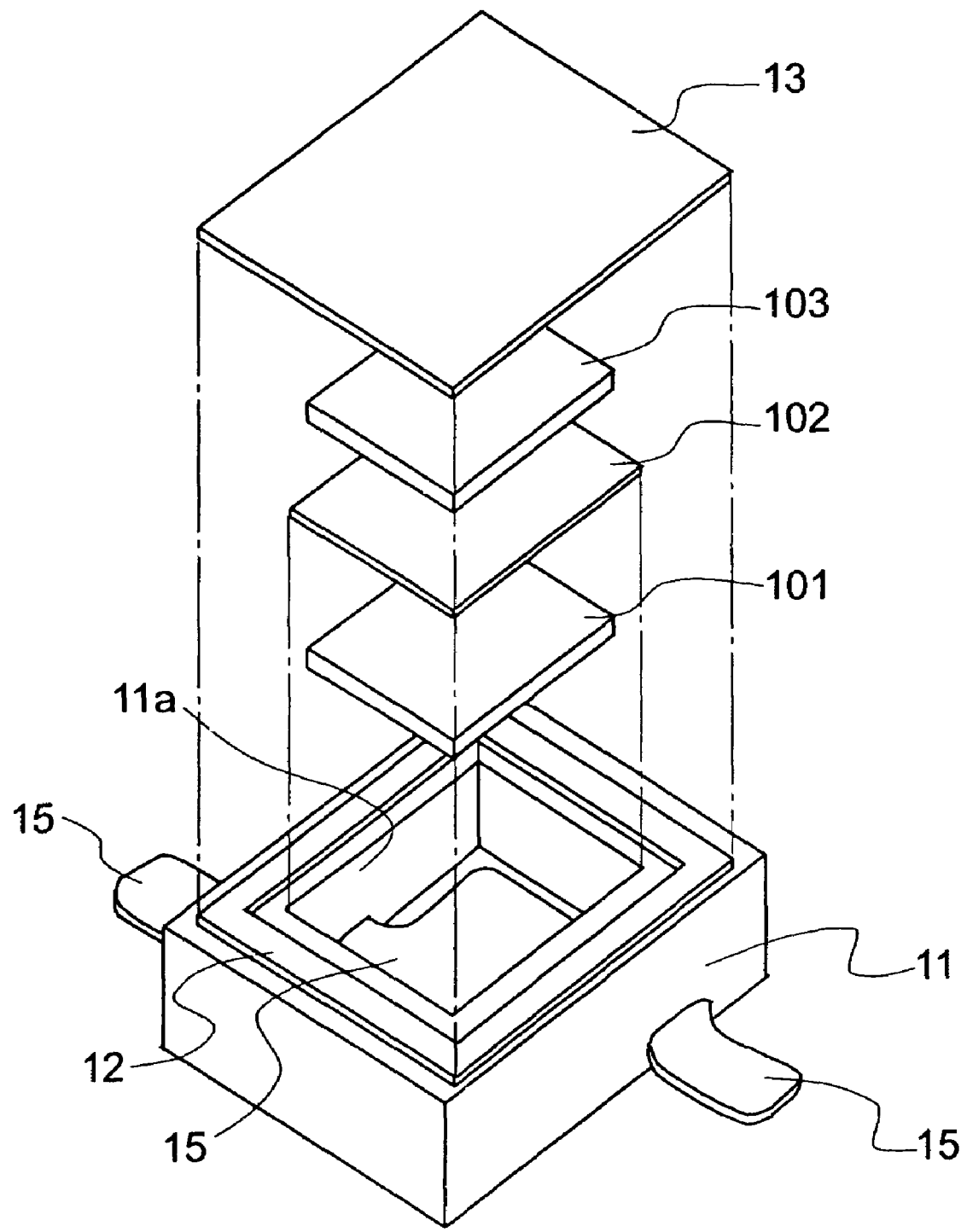
FIG. 1 is a schematic diagram illustrating an electrochemical cell according to the invention.

Hereinafter, an embodiment according to the invention will be described with reference to FIGS. 1 to 12.

In FIGS. 1 to 3, 11 depicts a base member made of a resin material formed in a box shape having a cavity or recessed part 11a for configuring a container with a conductive terminal 15 penetrating through the wall surfaces of the base member 11 from the inner side of the recessed part 11a to the outer side thereof and a frame member 12 joined to the base member 11. Furthermore, a positive electrode active material 101 is attached to the conductive terminal 15 with a conductive adhesive, and a separator 102 and an electrolyte not shown in the drawing are housed in the recessed part 11a. Moreover, a negative electrode active material 103 is attached to a cover member 13 with the conductive adhesive, and the frame member 12 is overlaid and welded with the cover member 13. Stainless steel or aluminium is used for the conductive terminal 15, and stainless steel, aluminium or FeNi alloy is used for the frame member 12 and the cover member 13.

Here, as the material for the conductive terminal, metals having suitable pressing, cutting and welding properties are used from stainless steel such as 19 Cr-9Ni steel and 18 Cr-12 Ni—Mo—Cu steel, and aluminium and aluminium alloys. The material for the frame member and the cover member includes stainless steel such as 19 Cr-9 Ni steel and 18 Cr-12 Ni—Mo—Cu steel, aluminium and aluminium alloys, FeNi alloys such as 42 alloy and FeNiCo alloy. Furthermore, as the method for welding the cover member with the frame member, these methods are used: a method of using optical absorption such as YAG laser, semiconductor laser, and lamp heating; a method of using frictional heat in which an ultrasonic transducer is pressed against the cover member to rub between it and the frame member; and a method of using resistance heating in which current is carried through the cover member or between the cover member and the frame member for heating. Moreover, the use of a brazing material for a joint material of the cover member to the frame member is also included. As the brazing material, Ni plating, Sn plating, or AgCu alloy is used. Here, in order to easily join the brazing materials for the cover member and the frame member each other, the application of flash plating such as Au or Pt to the surface of the brazing materials is included.

Besides, insulating resins can be applied as the material for the base member. These resins are suitable in the aspects of stiffness and heat resistant properties: thermosetting resins with heat resistance such as epoxies and polyimides, and thermoplastic resins such as polystyrenes, polyphenylene sulfides, polyesters, polyamides and polyethers. Here, syndiotactic polystyrene is selected as polystyrenes, linear or cross-linked polyphenylene sulfide is selected as polyphenylene sulfides, all aromatic polyesters called liquid crystal polymers are selected as polyesters, nylon is selected as polyamides, and polyether ether ketone, polyether sulfone and polyetherimide are selected as polyethers. Furthermore, products that glass fiber, mica, and ceramics fine powder are added to these resins are also used.

Moreover, as an electrical power generation element for the electrochemical cell, which is housed in the container configured of the base member, the conductive terminal and the frame member, traditionally known products can be used for the non-aqueous electrolyte cell: lithium containing manganese oxides, lithium containing cobalt oxides and lithium containing titanium oxides for the positive electrode active material, and carbon, lithium alloys, transition metal oxides and silicon oxides for the negative electrode active material. For the electric double layer capacitor, activated carbon can be used for the positive and negative electrode active materials.

Besides, as the separator, an insulating film having a great ion permeability and a given mechanical strength is used. In consideration of mounting in the reflow furnace, glass fiber can be used stably, but resins such as polyphenylene sulfide, polyethylene terephthalate, polyamide and polyimide can be used as well. The pore diameter and thickness of the separator are not defined particularly, which are design items determined based on current values for devices for use and the internal resistance of the electrochemical cell. In addition, ceramics porous products can be used as well.

As the solvent for the electrolyte solution, a traditional non-aqueous solvent is used when the electric double layer capacitor and the non-aqueous secondary battery are taken as examples. This non-aqueous solvent includes cyclic esters, chain esters, cyclic esters and chain esters. In consideration of reflow mounting, a single or a complex product selected from γ-butyrolactone (γBL), propylene carbonate (PC) and ethylene carbonate (EC) can be used alone.

As the electrolyte, one kind or more of salts can be used, including $(C_2H_5)_4PBF_4$, $(C_3H_7)_4PBF_4$, $(CH_3)(C_2H_5)_3NBF_4$, $(C_2H_5)_4NBF_4$, $(C_2H_5)_4PPF_6$, $(C_2H_5)_4PCF_3SO_4$, $(C_2H_5)_4NPF_6$, lithium salt such as lithium perchlorate ($LiClO_4$), lithium phosphate hexafluoride ($LiPF_6$), lithium borofluoride ($LiBF_4$), lithium phosphate hexafluoride ($LiAsF_6$), lithium trifluoromethane sulfonate ($LiCF_3SO_3$), and bis (trifuluoromethylsulfonylimide lithium [$LiN(CF_3SO_2)_2$], thiocyanogen salt, and aluminium fluoride salt. The electrolyte can be used in a gel form or solid form in combination with a non-aqueous solvent, a supporting salt, and polymers including polyethylene oxide derivatives or polyethylene oxide derivatives, polymers including polypropylene oxide derivatives or polypropylene oxide derivatives, phosphate ester polymer, and PVDF. Furthermore, the use of an inorganic solid electrolyte of $LiS/SiS_2/Li_4SiO_4$ is included. Moreover, ionic liquids such as pyridines, alicyclic amines, and aliphatic amines and cold molten salts such as amidines are acceptable. The use thereof exerts the advantage that suppresses the generation of steam in welding the cover member with the frame member.

Besides, the safety valve function of the base member includes partially reducing the thickness of the base member. Additionally, the safety valve function provided for the joint part of the frame member to the cover member includes locally forming a weak joining part. The safety valve function serves as a role to release the gas of internal pressure increase when an abnormal event is generated such as overcurrent or external heating, and thus avoids accidents such as a rupture. In the invention, the safety valve function can be added to the electrochemical cell with no cost increase.

In the embodiment according to the invention, the joint part of the base member 11 to the conductive terminal 15 and the joint part of the base member 11 to the frame member 12 are closely contacted with each other regardless of the shape, and the sealing property by metal contact can also be obtained in welding the frame member 12 with the cover member 13. Therefore, there are no limitations on the shapes. More specifically, even though the base member 11 is a rectangular container, it prevents humidity from entering externally, and the characteristics of the electrochemical cell can be maintained even after it is passed through the reflow furnace set at a solder melting point (200 to 260° C.).

EXAMPLE 1

Figure 2:
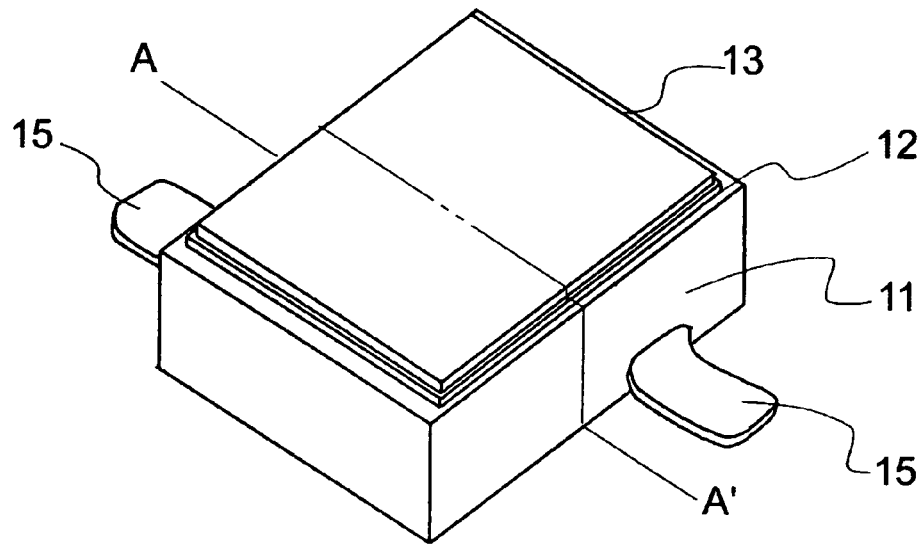
FIG. 2 is an outside diagram illustrating the electrochemical cell according to the invention.
Figure 3:
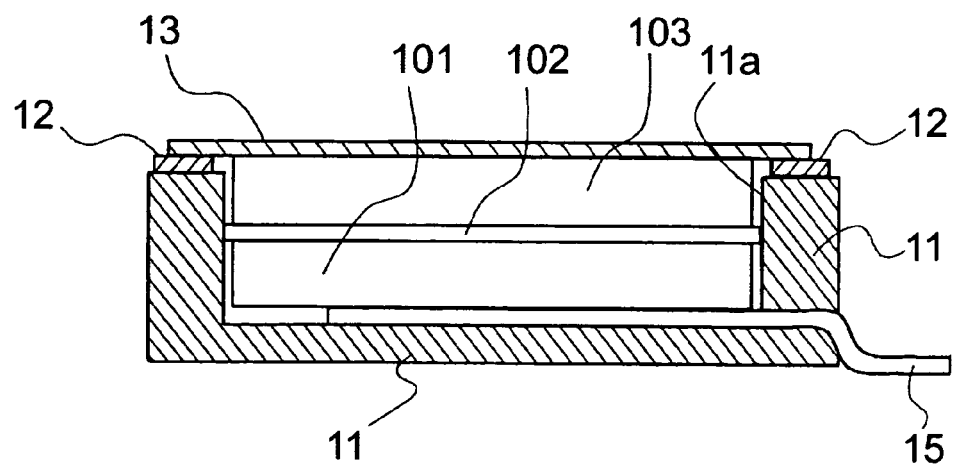
FIG. 3 is a cross-sectional view illustrating the electrochemical cell according to the invention.

FIG. 1 shows a schematic diagram illustrating an electrochemical cell according to the invention. FIG. 2 shows an outside diagram illustrating the electrochemical cell according to the invention. FIG. 3 shows a cross-sectional view illustrating the electrochemical cell according to the invention.

In this example, an epoxy was used for a base member 11, and 18 Cr-12 Ni—Mo—Cu steel of stainless steel was used for a conductive terminal 15. Tin was plated over the portions where the conductive terminal 15 was extended to the outer wall of the base member 11 for facilitating solder joint to a mounting substrate. 42 Ni—Fe alloy was used for a frame member 12 and a cover member 13. An active material was prepared by kneading carbon black as a conductive material and PTFE as a binder with activated carbon commercially available. The kneaded product was rolled by roll press to form into a sheet, and it was cut to form a positive electrode active material 101 and a negative electrode active material 103. For an electrolyte, $(C_2H_5)_4NBF_4$ was dissolved in PC for use. Here, as an assembly method of the electrochemical cell, the conductive terminal 15 and the frame member 12 were placed in a base member forming mold, and an epoxy resin was injected thereinto to form the base member 11 in a box shape having a recessed part 11a. The conductive terminal 15 was attached to the positive electrode active material 101, and then a separator 102 was housed in the recessed part 11a. Subsequently, the cover member 13 attached with the negative electrode active material 103 was overlaid with the frame member 12 for seam welding of the resistance heating method.

In order to evaluate the sealing property of the electrochemical cell, the cell was immersed in a fluorine liquid for a leak test. It was revealed that the cell had a sealing property of $10^{-5}$ atom·cc/sec or greater. In addition, the electrochemical cell was soldered through a reflow furnace where a first zone was at a temperature of 160° C. for two minutes, a second zone was at a temperature of 200° C. or higher for one minute, and a peak temperature was 260° C. It was confirmed that the characteristics were not varied before and after soldered.

EXAMPLE 2

Figure 4:
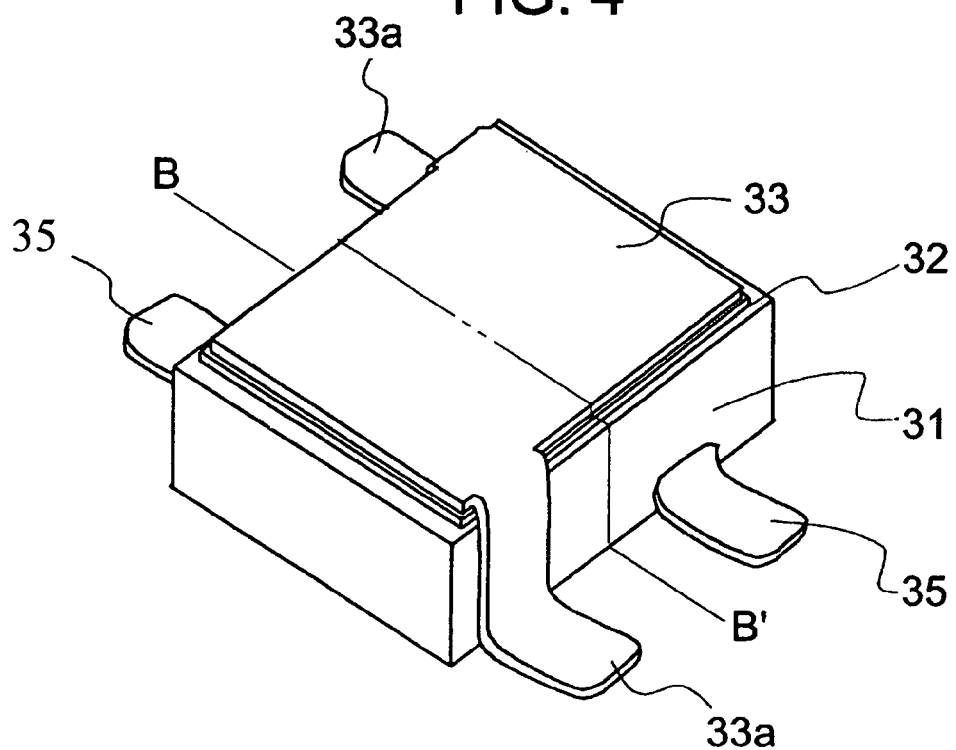
FIG. 4 is an outside diagram illustrating an electrochemical cell according to the invention.
Figure 5:
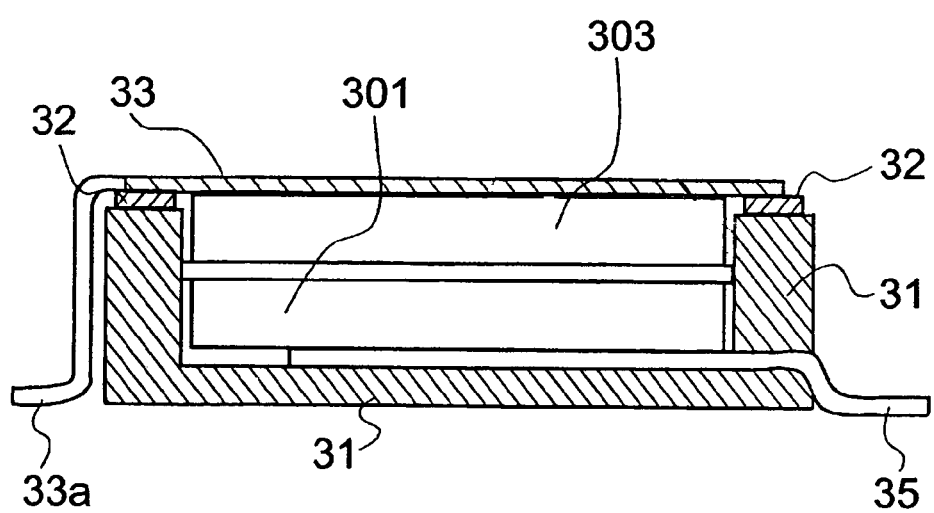
FIG. 5 is a cross-sectional view illustrating the electrochemical cell according to the invention.

FIG. 4 shows an outside diagram illustrating an electrochemical cell according to the invention. FIG. 5 shows a cross-sectional view illustrating the electrochemical cell according to the invention.

In a cover terminal, one end thereof is connected to the side surface of a cover member and extended therefrom. It is bent in parallel with the side surface of the base member, and extended along the side surface of the base member to the bottom part. The other end thereof is bent on a surface contacting with a land, and has the surface contacting with the land on almost the same plane as the bottom surface of the base member. One end of a conductive terminal is placed on the bottom surface inside a container, and the other end thereof is extended through outside the container. This other end is also bent on a surface contacting with the land, and has the surface contacting with the land on almost the same plane as the bottom surface of the base member.

An epoxy was used for the base member 31, and 18 Cr-12 Ni—Mo—Cu steel of stainless steel was used for the conductive terminal 35. A cover connecting terminal 33a was extended from the cover member 33. Tin was plated over the portion where the conductive terminal 35 was extended from the outer wall of the base member 11 and over the cover connecting terminals 33a, for facilitating solder joint to a mounting substrate. 42 Ni—Fe alloy was used for a frame member 32 and the cover member 33. An active material was prepared by kneading carbon black as a conductive material and PTFE a binder with activated carbon commercially available. The kneaded product was rolled by roll press to form into a sheet, and it was cut to form a positive electrode active material 301 and a negative electrode active material 303. For an electrolyte, $(C_2H_5)_4NBF_4$ was dissolved in PC for use.

The cover member 33 was plated with nickel 2 μm in thickness and gold 0.5 μm in thickness, and the frame member 32 was plated with nickel 2 μm in thickness for seam welding of the resistance heating method. Here, nickel was plated over the cover member 33 and the frame member 32 functioned as a brazing material for hermetic sealing. In order to evaluate the sealing property of the electrochemical cell thus fabricated, the cell was immersed in a fluorine liquid for a leak test. It was revealed that the cell had a sealing property of $10^{-5}$ atom·cc/sec or greater. In addition, the electrochemical cell was soldered through a reflow furnace where a first zone was at a temperature of 160° C. for two minutes, a second zone was at a temperature of 200° C. or higher for one minute, and a peak temperature was 260° C. It was confirmed that the characteristics were not varied before and after soldered.

EXAMPLE 3

For a base member 11, the base member 11 was formed of polyphenylene sulfide of a thermoplastic resin.

Aluminum was used for a conductive terminal 15. Nickel was plated over a portion where the conductive terminal 15 was extended from the outer wall of the base member 11, for facilitating solder joint to a mounting substrate. 42 Ni—Fe alloy was used for a frame member 12 and a cover member 13. An active material was prepared by kneading carbon black as a conductive material and PTFE as a binder with activated carbon commercially available. The kneaded product was rolled by roll press to form into a sheet, and it was cut to form a positive electrode active material 101 and a negative electrode active material 103. For an electrolyte, $(C_2H_5)_4NBF_4$ was dissolved in PC for use. The cover member 33 was plated with nickel 2 μm in thickness and gold 0.5 μm in thickness, and the frame member 12 was plated with nickel 2 μm in thickness for seam welding of the resistance heating method. Here, nickel was plated over the cover member 13 and the frame member 12 functioned as a brazing material for hermetic sealing.

In order to evaluate the sealing property of the electrochemical cell thus fabricated, the cell was immersed in a fluorine liquid for a leak test. It was revealed that a cell had the sealing property of $10^{-5}$ atom·cc/sec or greater. In addition, the electrochemical cell was soldered through a reflow furnace where a first zone was at a temperature of 160° C. for two minutes, a second zone was at a temperature of 200° C. or higher for one minute, and a peak temperature was 260° C. It was confirmed that the characteristics were not varied before and after soldered.

EXAMPLE 4

Figure 6:
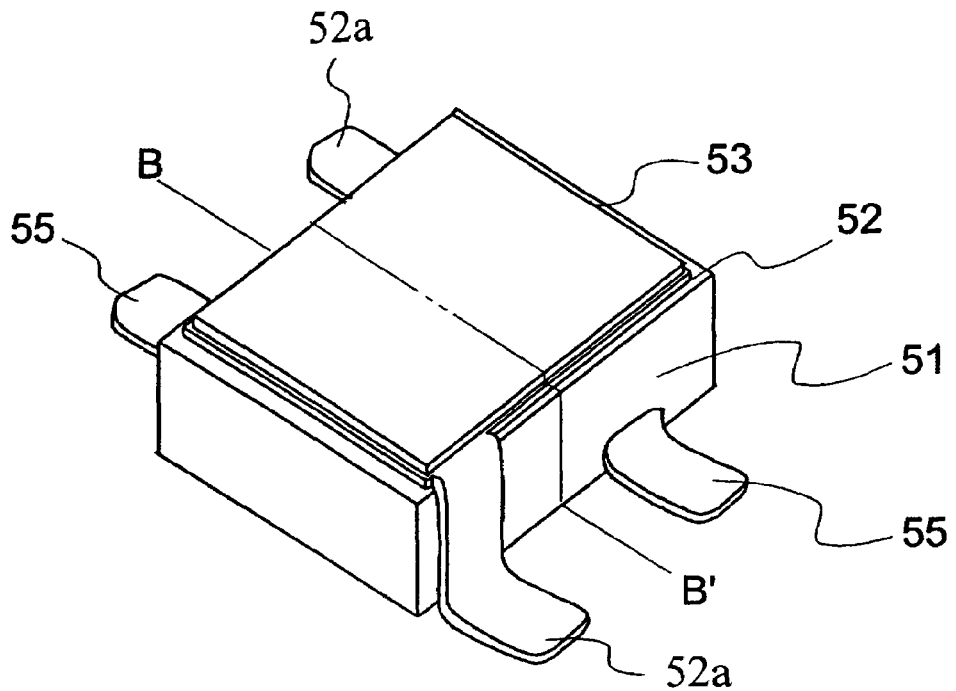
FIG. 6 is an outside diagram illustrating an electrochemical cell according to the invention.
Figure 7:
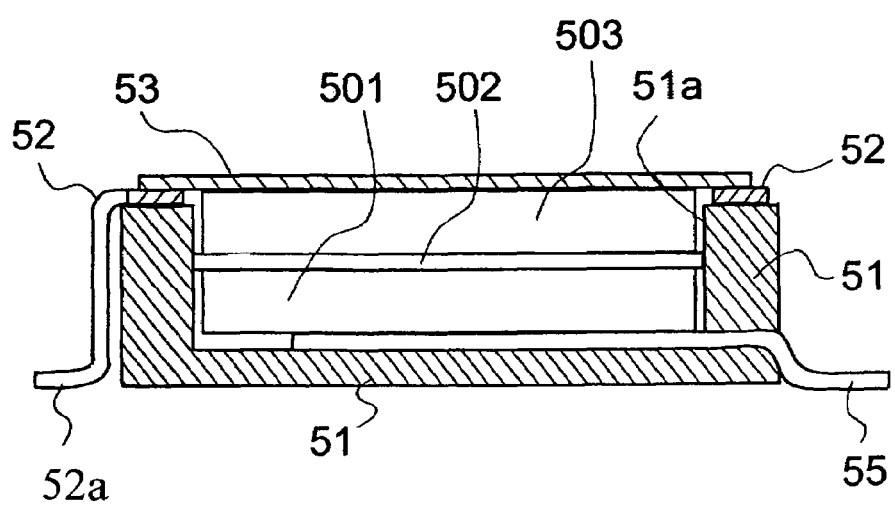
FIG. 7 is a cross-sectional view illustrating the electrochemical cell according to the invention.

FIG. 6 shows an outside diagram illustrating an electrochemical cell according to the invention. FIG. 7 shows a cross-sectional view illustrating the electrochemical cell according to the invention.

In a frame connecting terminal, one end thereof is connected to the side surface of a frame member and extended therefrom. It is bent in parallel with the side surface of the base member, and extended along the side surface of the base member to the bottom part. The other end thereof is bent on the surface contacting with a land, and has a surface contacting with the land on almost the same plane as the bottom surface of the base member. One end of a conductive terminal is placed on the bottom surface inside a container, and the other end thereof is extended through outside the container. This other end is also bent on a surface contacting with the land, and has the surface contacting with the land on almost the same plane as the bottom surface of the base member.

In this example, the portion where the frame connecting terminal 52a was extended from the frame member 52 and the portion where the conductive terminal 55 was extended from the outer wall of the base member 51 were placed on the same plane. Here, as an assembly method of the electrochemical cell, the conductive terminal 55 and the frame member 52 were placed in a forming mold of the base member, and an epoxy resin was injected to form the base member 51 in a box shape having a recessed part 51a. The conductive terminal 55 was attached to a positive electrode active material 501 with a conductive adhesive, and then a separator 502 was housed in the recessed part 51a. Subsequently, the cover member 53 attached to a negative electrode active material 503 with the conductive adhesive was overlaid with the frame member 52 for seam welding of the resistance heating method. Since an amount of heat for welding is released near the frame connecting terminal 52a extended from the frame member 52, a scheme was done to increase the amount of current for control to form a sealing structure.

In order to evaluate the sealing property of the electrochemical cell thus fabricated, the cell was immersed in a fluorine liquid for a leak test. It was revealed that the cell had a sealing property of $10^{-5}$ atom·cc/sec or greater. In addition, the electrochemical cell was soldered through a reflow furnace where a first zone was at a temperature of 160° C. for two minutes, a second zone was at a temperature of 200° C. or higher for one minute, and a peak temperature was 260° C. It was confirmed that the characteristics were not varied before and after soldered.

EXAMPLE 5

Figure 8:
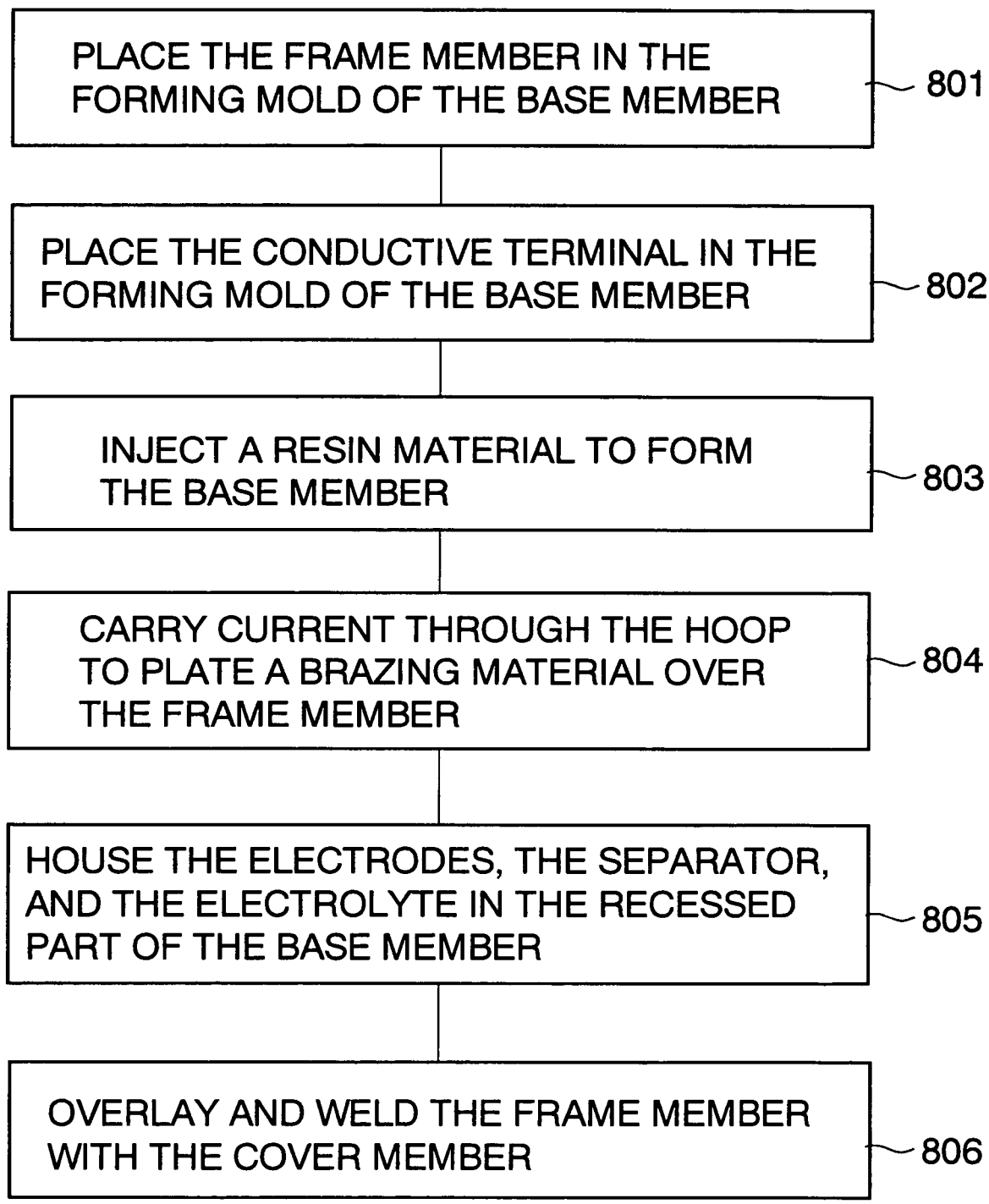
FIG. 8 is a flow chart for describing a fabrication method of the electrochemical cell according to the invention.
Figure 9:
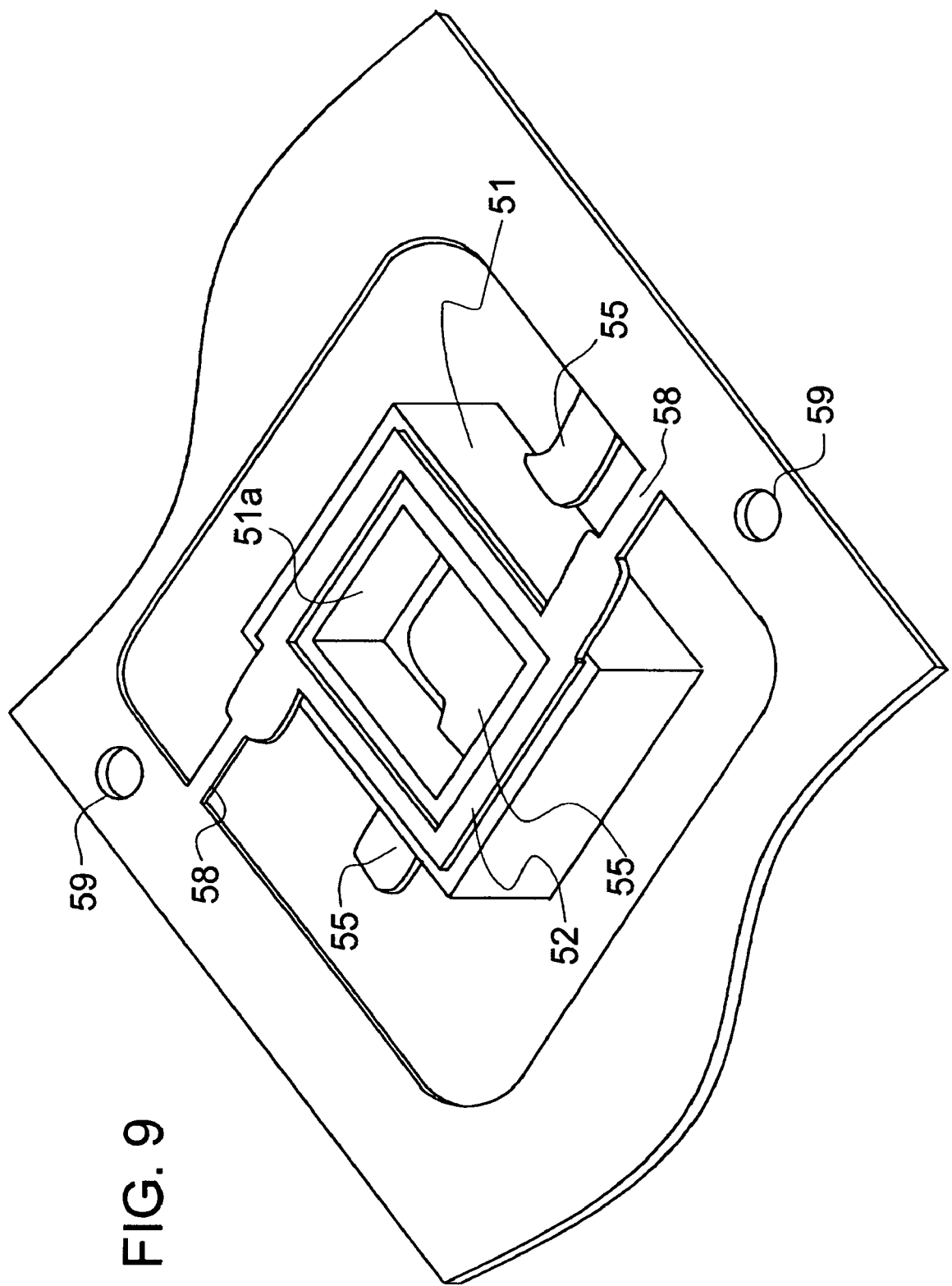
FIG. 9 is an outside diagram for describing the fabrication method of the electrochemical cell according to the invention.

FIG. 8 shows a flow chart for describing a fabrication method of the electrochemical cell according to the invention. FIG. 9 shows an outside diagram for describing the fabrication method of the electrochemical cell according to the invention.

The frame member 52 formed in a hoop is placed in the forming mold of the base member (step 801). The conductive terminal 55 is placed in the forming mold of the base member (step 802). Subsequently, a resin material is injected into the forming mold of the base member to form the base member 51 in a box shape having the recessed part 51a, and the conductive terminal 55 and the frame member 52 are assembled into the container (step 803). Then, current is carried through the hoop to plate a brazing material over the frame member 52 (step 804). A pair of the electrodes, the separator and the electrolyte are housed in the recessed part 51a of the base member (step 805). The frame member 52 is overlaid and welded with the cover member, not shown, by a heating unit (step 806).

Here, 18 Cr-12 Ni—Mo—Cu steel of stainless steel was used for the conductive terminal 55. A thin plate of 42 Ni—Fe alloy was used for the frame member 52 for press working to prepare the hoop. In press working, the plate was punched to form perforations 59 also used for positioning a work in each step and bridges 58 for holding the frame member 53. An epoxy was used for the resin material of the base member 51. The epoxy of thermosetting resin was cured by heating the forming mold of the base member. At this time, the conductive terminal 55 and the frame member 52 placed in the forming mold of the base member are closely contacted with the epoxy of the base member 51, and can be shaped in a desired form. Nickel was used for the brazing material plated over the frame member 52, and was plated 2 µm in thickness. 42 Ni—Fe alloy was used for the cover member, and nickel was plated 2 µm in thickness. Here, resistance heating was used as the heating unit. More specifically, two roller electrodes were prepared, and pressed against the both ends of the cover member in good balance, and current was carried between the electrodes. The parts of the electrodes contacted with the cover member were heated to melt the nickel plating on the cover member and on the frame member 52. The nickel plating was solidified to join the cover member to the frame member 52. This process was repeated by rolling the electrodes in a roll. After this welding, the bridges 58 connected to the frame member 52 were cut from the hoop to fabricate the electrochemical cell. The electrochemical cell was immersed in a fluorine liquid for a leak test. It was revealed that the cell had a sealing property of $10^{-5}$ atom·cc/sec or greater. In addition, the electrochemical cell was soldered through a reflow furnace where a first zone was at a temperature of 160° C. for two minutes, a second zone was at a temperature of 200° C. or higher for one minute, and a peak temperature was 260° C. It was confirmed that the characteristics were not varied before and after soldered.

EXAMPLE 6

Figure 10:
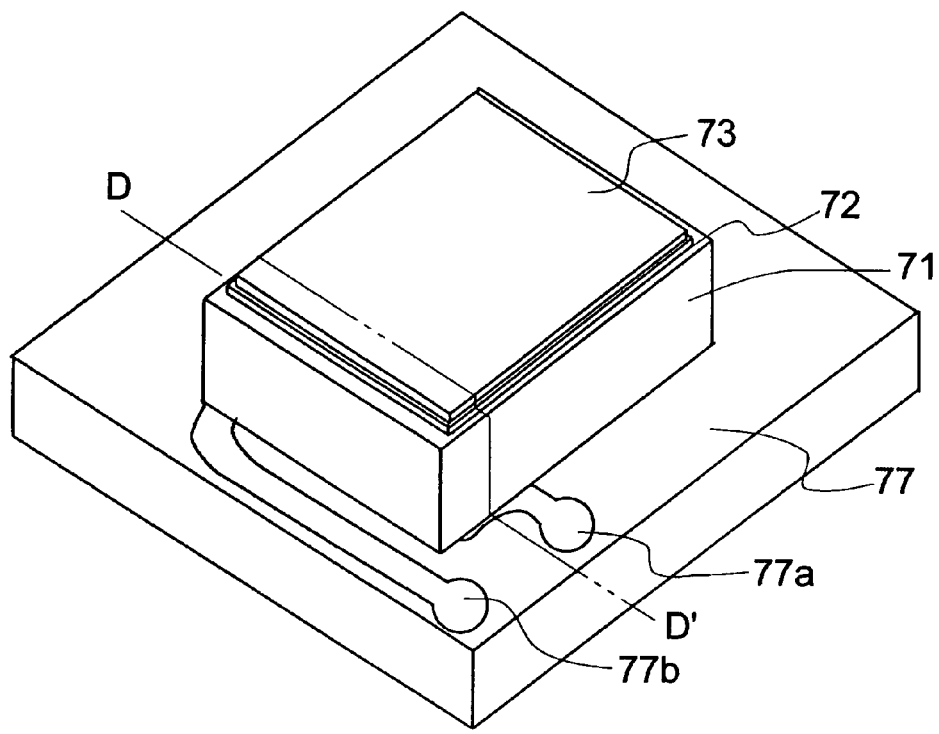
FIG. 10 is an outside diagram illustrating an electrochemical cell according to the invention.
Figure 11:
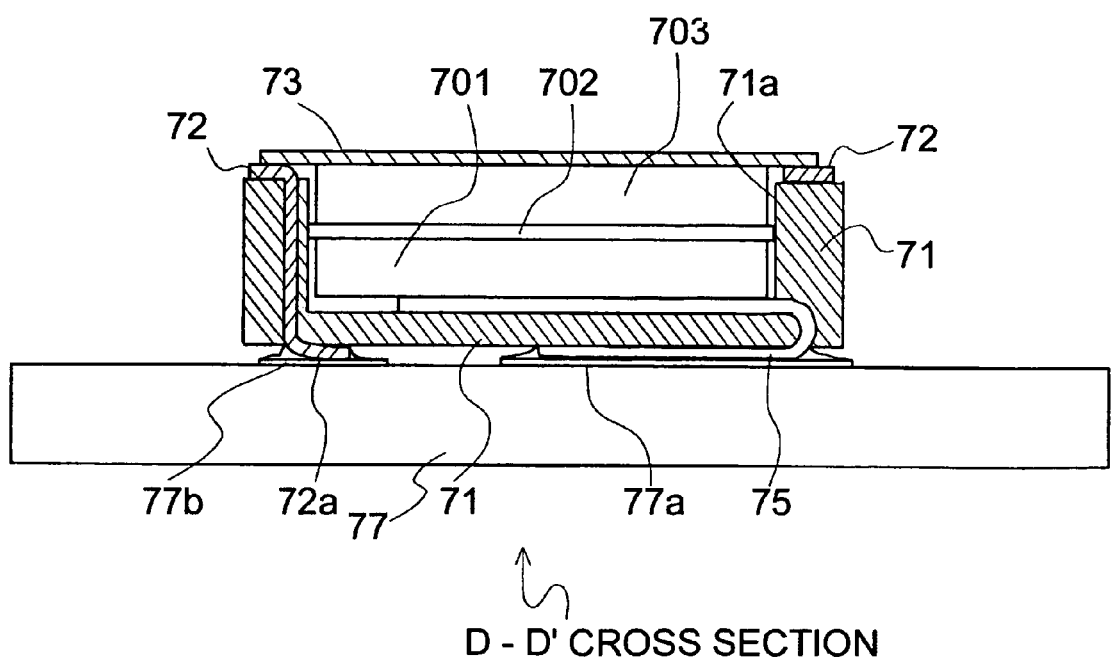
FIG. 11 is a cross-sectional view illustrating the electrochemical cell according to the invention.

FIG. 10 shows an outside diagram illustrating an electrochemical cell according to the invention. FIG. 11 shows a cross-sectional view illustrating the electrochemical cell according to the invention.

In this example, the electrochemical cell according to the invention was joined to a positive electrode wiring pattern 77a and a negative electrode wiring pattern 77b formed on a mounting substrate 77. As the configuration of the electrochemical cell, a frame connecting terminal 72a extended from a frame member 72 and the portion where a conductive terminal 75 extended from the outer wall of a base member 71 were placed on the same plane. Here, as an assembly method of the electrochemical cell, the conductive terminal 75 and the frame member 72 were placed in a forming mold of the base member, and an epoxy resin was injected to form the base member 71 in a box shape having a recessed part 71a. The conductive terminal 75 was attached to a positive electrode active material 701 with a conductive adhesive, and then a separator 702 was housed in the recessed part 71a. Subsequently, the cover member 73 attached to a negative electrode active material 703 with the conductive adhesive was overlaid with the frame member 72 for seam welding of the resistance heating method. The conductive terminal 75 and the frame connecting terminal 72a extended over the lower end surface of the base member 71 were bent inside as facing each other. After this, the cell was placed on lands of the positive electrode wiring pattern 72a and the negative electrode wiring pattern 72b for soldering through a reflow furnace where preheating was at a temperature of 180° C. for ten minutes, and heating was at a temperature of 240° C. for one minute.

In order to evaluate the sealing property of the electrochemical cell, the cell was immersed in a fluorine liquid for a leak test. It was revealed that the cell had a sealing property of $10^{-5}$ atom·cc/sec or greater. In addition, the electrochemical cell was soldered through a reflow furnace where a first zone was at a temperature of 160° C. for two minutes, a second zone was at a temperature of 200° C. or higher for one minute, and a peak temperature was 260° C. It was confirmed that the characteristics were not varied before and after soldered.

EXAMPLE 7

In order to confirm that it is advantageous for the reduction in the size of the electrochemical cell, the cell was fabricated where the outer shape of the base member 51 was 3 mm in width and 5 mm in thickness, and the thickness of the base member 51 was 1 mm from the bottom surface to the top surface of the cover member. The guide holes 59 of φ1 mm were formed in the frame of the hoop, and guide pins were inserted for positioning by fitting to the guide holes 59 at a space of 10 µm. The electrodes, the separator and the electrolytes were incorporated, and then the frame member 52 was overlaid and welded with the cover member. The displacement was within 20 µm in assembling and welding these components. Consequently, even though variations are creased in the outer shape of the base member 51, the positions of the guide holes 59 formed in the frame of the hoop connected to the frame member 52 by the bridges 58 are formed highly accurately. Therefore, the electrodes, the separator and the electrolyte can be incorporated easily, and the cover member can be welded easily. More specifically, it was confirmed that the fabrication method was advantageous for the reduction in the size of the electrochemical cell. The fabricated electrochemical cell was evaluated as similar to the examples 1 to 6. As the evaluation method, the cell was soldered through a reflow furnace where a first zone was at a temperature of 160° C. for two minutes, a second zone was at a temperature of 200° C. or higher for one minute, and a peak temperature was 260° C. It was confirmed that no leakage was found before and after soldered, and that the capacity was not varied. The measurement conditions for capacity were that the cell was charged at 2.5 V for 30 minutes and then it was discharged at a current of 20 µA. The result is shown in Table 1.

Figure 12:
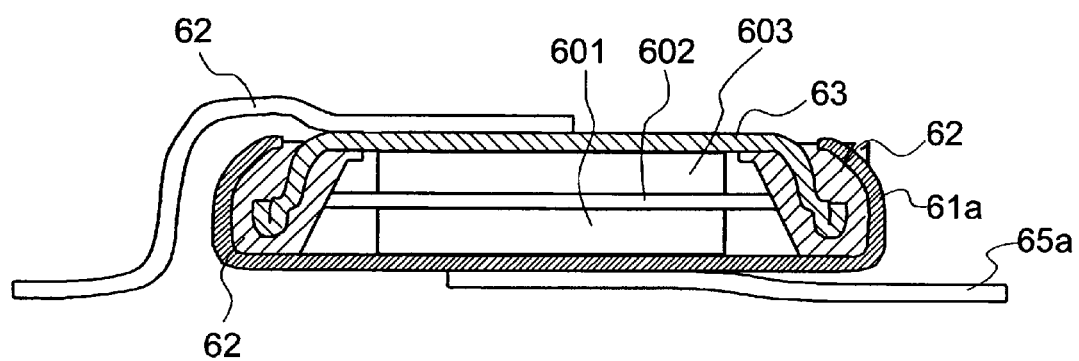
FIG. 12 is a cross-sectional view illustrating the traditional electrochemical cell.

FIG. 12 shows a traditional coin type electrochemical cell having the outer diameter of φ3 mm and the thickness of 0.8 mm. The coin type cell does not have positive and negative electrodes on the same plane. Thus, the coin type electrochemical cell with terminals of surface mounting type was fabricated in which a positive electrode terminal 65a formed of a metal plate 0.1 mm in thickness was welded to a positive electrode case 61, and a negative electrode terminal 65b formed of a metal plate 0.1 mm in thickness was welded to a negative electrode case 63, where the width was 3 mm, the length was 5 mm, and the thickness was 1 mm. The electrochemical cell was evaluated as similar to the examples 1 to 7. As the evaluation method, the cell was soldered through a reflow furnace where a first zone was at a temperature of 160° C. for two minutes, a second zone was at a temperature of 200° C. or higher for one minute, and a peak temperature was 260° C. It was confirmed that no leakage was found before and after soldered, and that the capacity was not varied. The measurement conditions for capacity were that the cell was charged at 2.5 V for 30 minutes and then it was discharged at a current of 20 μA.

TABLE 1

| | Before Reflow Soldering | | | After Reflow Soldering Capacity (mF) |
|---|---|---|---|---|
| | Mounting Area (mm²) | Capacity (mF) | Capacity Per Mounting Area (mF/mm²) | |
| Example 7 | 15 | 40 | 2.7 | 40 |
| Comparative Example | 15 | 10 | 0.7 | 10 |

What is claimed is:

1. An electrochemical cell comprising:
   a separator;
   a pair of electrodes disposed on respective top and bottom surfaces of the separator; and
   a container for housing the separator, the pair of electrodes, and an electrolyte impregnated in the pair of the electrodes, wherein the container includes:
   a base member having a bottom part and a side part disposed on a top surface of the bottom part along an outer rim of the bottom part, the bottom part and the side part being formed in one piece;
   a conductive terminal made of a metallic material and penetrating through inner and outer sides of the base member, the conductive terminal having a first surface and a second surface disposed opposite the first surface, the first surface being disposed on the top surface of the bottom part of the base member, and the second surface being disposed in contact with one of the pair of the electrodes;
   a frame member made of a metallic material and having a first surface and a second surface opposite to the first surface, the first surface of the frame member being joined to an entire rim of a top surface of the side part of the base member; and
   a cover member made of a metallic material joined to an entire rim of the second surface of the frame member.

2. The electrochemical cell according to claim 1, further comprising a cover connecting terminal having one end extended to a side surface of the cover member.

3. The electrochemical cell according to claim 2, wherein a part of another end of the cover terminal and a part of one end of the conductive terminal that extends from the base member have surfaces that lie on a same plane.

4. The electrochemical cell according to claim 1, further comprising a frame connecting terminal having one end extended to a side surface of the frame member.

5. The electrochemical cell according to claim 4, wherein a part of another end of the frame connecting terminal and a part of one end of the conductive terminal that extends from the base member have surfaces that lie on a same plane.

6. The electrochemical cell according to claim 5, wherein the one end of the frame connecting terminal extends from the side surface of the frame member and penetrates from an upper end portion of the side part of the base member to a bottom surface of the bottom part of the base member through a surface where the side part of the base member is disposed in contact with the bottom part of the base member.

7. The electrochemical cell according to claim 6, wherein the another end of the frame connecting terminal or the one end of the conductive terminal contacts the bottom surface of the bottom part.

8. The electrochemical cell according to claim 7, wherein the conductive terminal is formed of stainless steel or aluminium.

9. The electrochemical cell according to claim 8, wherein the frame member and the cover member are formed of a material selected from the group consisting of stainless steel, aluminium, and FeNi alloy.

10. The electrochemical cell according to claim 9, wherein the conductive terminal is formed of stainless steel, and the frame member and the cover member are formed of FeNi alloy.

11. The electrochemical cell according to claim 10, wherein the cover member is welded with the frame member.

12. The electrochemical cell according to claim 11, wherein a brazing material of nickel or silver alloy is plated over the frame member and the cover member.

13. The electrochemical cell according to claim 12, wherein at least a part of a joint part of the frame member overlaid and welded with the cover member has an opening for discharging the electrolyte when an internal pressure of the electrochemical cell rises.

14. The electrochemical cell according to claim 13, wherein the base member is formed of a material selected from the group consisting of epoxies, polyimides, polystyrenes, polyphenylene sulfides, polyesters, polyamides, and polyethers.

15. The electrochemical cell according to claim 14, wherein at least one part of the base member or the cover member has an opening for discharging the electrolyte when an internal pressure of the electrochemical cell rises.

16. The electrochemical cell according to claim 1, wherein the conductive terminal is formed of stainless steel or aluminium.

17. The electrochemical cell according to claim 1, wherein the cover member is welded with the frame member.

18. The electrochemical cell according to claim 1, wherein the base member is formed of a material selected from the group consisting of epoxies, polyimides, polystyrenes, polyphenylene sulfides, polyesters, polyamides, and polyethers.

19. The electrochemical cell according to claim 1, wherein at least one part of the base member or the cover member has an opening for discharging the electrolyte when an internal pressure of the electrochemical cell rises.

20. The electrochemical cell according to claim 2, wherein another end of the cover connecting terminal or one end of the conductive terminal contacts the bottom surface of the bottom part.

21. The electrochemical cell according to claim 2, wherein the conductive terminal is formed of stainless steel or aluminium.

22. The electrochemical cell according to claim 2, wherein the cover member is welded with the frame member.

23. The electrochemical cell according to claim 2, wherein the base member is formed of a material selected from the group consisting of epoxies, polyimides, polystyrenes, polyphenylene sulfides, polyesters, polyamides, and polyethers.

24. The electrochemical cell according to claim 2, wherein at least one part of the base member or the cover member has an opening formed for discharging the electrolyte when an internal pressure of the electrochemical cell rises.

25. The electrochemical cell according to claim 4, wherein another end of the frame connecting terminal or one end of the conductive terminal contacts the bottom surface of the bottom part.

26. The electrochemical cell according to claim 4, wherein the conductive terminal is formed of stainless steel or aluminium.

27. The electrochemical cell according to claim 4, wherein the cover member is welded with the frame member.

28. The electrochemical cell according to claim 4, wherein the base member is formed of a material selected from the group consisting of epoxies, polyimides, polystyrenes, polyphenylene sulfides, polyesters, polyamides, and polyethers.

29. The electrochemical cell according to claim 4, wherein at least one part of the base member or the cover member has an opening formed for discharging the electrolyte when an internal pressure of the electrochemical cell rises.

30. An electrochemical cell comprising:
a base member made of a dielectric material and having a bottom part and a side part disposed on an upper surface of the bottom part to define a cavity, the bottom part and the side part being formed in one piece;
a pair of electrodes containing an electrolyte and housed in the cavity of the base member;
a separator disposed in the cavity of the base member and separating the pair of electrodes from one another;
a conductive terminal extending through the base member from the cavity to an exterior of the base member so that a first portion of the conductive terminal is disposed in the cavity in contact with one of the pair of electrodes and a second portion of the conductive terminal is disposed on the exterior of the base member;
a frame member having first and second opposite main surfaces, the first main surface being joined to an entire rim of a top surface of the side part of the base member; and
a cover member joined to an entire rim of the second main surface of the frame member.

31. An electrochemical cell according to claim 30; wherein the conductive terminal, the cover member, and the frame member are formed of a metallic material.

32. An electrochemical cell according to claim 30; wherein the first main surface of the frame member is disposed in direct contact with the top surface of the side part of the base member and the second main surface of the frame member is disposed in direct contact with the cover member.

33. An electrochemical cell according to claim 30; further comprising a connecting terminal disposed on the exterior of the base member and having one end connected to the cover member.

34. An electrochemical cell according to claim 30; further comprising a connecting terminal disposed on the exterior of the base member and having one end connected to the frame member.

35. An electrochemical cell according to claim 30; further comprising a connecting terminal extending through the side part of the base member so that a first end of the connecting terminal is connected to the frame member and a second end of the connecting terminal is disposed on the exterior of the base member.

36. An electrochemical cell according to claim 35; wherein the second end of the connecting terminal and an end of the second portion of the conductive terminal are disposed in contact with an exterior surface of the bottom part of the base member.

37. An electrochemical cell according to claim 30; wherein the pair of electrodes comprises a positive electrode and a negative electrode; and wherein the first portion of the conductive terminal is connected directly to the positive electrode and the cover member is connected directly to the negative electrode.

38. An electrochemical cell according to claim 37; wherein the separator is connected directly to the side part of the base member.

39. An electrochemical cell comprising: a container for housing a separator and a pair of electrodes impregnated with an electrolyte, the container having a base member made of a dielectric material and comprised of a bottom part and a side part formed in one piece with and disposed on a top surface of the bottom part, a conductive terminal having first and second opposite surfaces penetrating through inner and outer sides of the base member with the first surface being disposed on the top surface of the bottom part of the base member and the second surface being disposed in contact with one of the pair of the electrodes, a frame member having first and second opposite main surfaces with the first main surface of the frame member being joined to an entire rim of a top surface of the side part of the base member, and a cover member joined to an entire rim of the second main surface of the frame member.

40. An electrochemical cell according to claim 39; wherein the conductive material, the cover member, and the frame member are formed of a metallic material.

41. An electrochemical cell according to claim 39; wherein the first main surface of the frame member is disposed in direct contact with the top surface of the side part of the base member and the second main surface of the frame member is disposed in direct contact with the cover member.

42. An electrochemical cell according to claim 39; wherein the pair of electrodes comprises a positive electrode and a negative electrode; and wherein the second surface of the conductive terminal is connected directly to the positive electrode and the cover member is connected directly to the negative electrode.

43. An electrochemical cell according to claim 42; wherein the separator is connected directly to the side part of the base member.

* * * * *